(12) United States Patent
Den Boef et al.

(10) Patent No.: US 8,830,447 B2
(45) Date of Patent: Sep. 9, 2014

(54) INSPECTION METHOD FOR LITHOGRAPHY

(75) Inventors: Arie Jeffrey Den Boef, Waalre (NL); Hugo Augustinus Joseph Cramer, Eindhoven (NL); Paul Christiaan Hinnen, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 265 days.

(21) Appl. No.: 13/264,256

(22) PCT Filed: May 4, 2010

(86) PCT No.: PCT/EP2010/056016
§ 371 (c)(1),
(2), (4) Date: Oct. 13, 2011

(87) PCT Pub. No.: WO2010/130600
PCT Pub. Date: Nov. 18, 2010

(65) Prior Publication Data
US 2012/0044472 A1  Feb. 23, 2012

Related U.S. Application Data

(60) Provisional application No. 61/177,468, filed on May 12, 2009.

(51) Int. Cl.
*G03B 27/52* (2006.01)
*G03F 7/20* (2006.01)

(52) U.S. Cl.
CPC .................................. *G03F 7/70641* (2013.01)
USPC .......................................................... 355/55

(58) Field of Classification Search
CPC ........................ G03F 7/70633; G03F 7/70641
USPC ............ 355/52, 53, 55, 67–71; 356/399–401, 356/625
See application file for complete search history.

(56) References Cited

U.S. PATENT DOCUMENTS

| 5,783,833 A | 7/1998 | Sugaya et al. |
| 6,674,511 B2 | 1/2004 | Nomura et al. |

(Continued)

FOREIGN PATENT DOCUMENTS

| EP | 1 628 164 A2 | 2/2006 |
| JP | 06-120118 A | 4/1994 |

(Continued)

OTHER PUBLICATIONS

Hung, K., et al.; "Scatterometry Measurements of Line End Shortening Structures for Focus-Exposure Monitoring," Proc. of SPIE 6152:6152W-1-6152W-12, Metrology, Inspection, and Process Control for Microlithography XX, 2006 12 pages.

(Continued)

*Primary Examiner* — Hung Henry Nguyen
(74) *Attorney, Agent, or Firm* — Sterne, Kessler, Goldstein & Fox, P.L.L.C.

(57) ABSTRACT

A method is used to determine focus of a lithographic apparatus used in a lithographic process on a substrate. The lithographic process is used to form at least two periodic structures on the substrate. Each structure has at least one feature that has an asymmetry between opposing side wall angles that varies as a different function of the focus of the lithographic apparatus on the substrate. A spectrum produced by directing a beam of radiation onto the at least two periodic structures is measured and ratios of the asymmetries are determined. The ratios and a relationship between the focus and the side wall asymmetry for each structure is used to determine the focus of the lithographic apparatus on the substrate.

20 Claims, 5 Drawing Sheets

(56) References Cited

U.S. PATENT DOCUMENTS

| | | | |
|---|---|---|---|
| 6,833,309 B2 * | 12/2004 | Fukuda | 438/401 |
| 6,975,399 B2 | 12/2005 | Fukui | |
| 7,382,447 B2 | 6/2008 | Mieher et al. | |
| 7,414,713 B2 | 8/2008 | Yamamoto | |
| 7,495,782 B2 * | 2/2009 | Finarov et al. | 356/625 |
| 7,573,584 B2 | 8/2009 | Den Boef et al. | |
| 7,599,064 B2 * | 10/2009 | Mos et al. | 356/401 |
| 7,710,572 B2 | 5/2010 | Mos et al. | |
| 7,771,905 B2 | 8/2010 | Sentoku et al. | |
| 7,791,727 B2 | 9/2010 | Den Boef et al. | |
| 7,911,612 B2 * | 3/2011 | Kiers et al. | 356/399 |
| 7,916,284 B2 | 3/2011 | Dusa et al. | |
| 2003/0048458 A1 | 3/2003 | Mieher et al. | |
| 2004/0190008 A1 | 9/2004 | Mieher et al. | |
| 2006/0250598 A1 | 11/2006 | Sasaki | |
| 2007/0050749 A1 | 3/2007 | Ye et al. | |
| 2007/0052948 A1 * | 3/2007 | Den Boef et al. | 356/124 |
| 2008/0018874 A1 | 1/2008 | Dusa et al. | |
| 2008/0043239 A1 | 2/2008 | Boef et al. | |
| 2008/0180647 A1 | 7/2008 | Sugino | |
| 2009/0147247 A1 | 6/2009 | Endo et al. | |
| 2011/0249247 A1 | 10/2011 | Cramer et al. | |

FOREIGN PATENT DOCUMENTS

| | | | |
|---|---|---|---|
| JP | 08-213306 A | 8/1996 | |
| JP | 10-154647 A | 6/1998 | |
| JP | 2000-077295 A | 3/2000 | |
| JP | 2000-114158 A | 4/2000 | |
| JP | 2001-250760 A | 9/2001 | |
| JP | 03-297423 B2 | 7/2002 | |
| JP | 2005-109016 A | 4/2005 | |
| JP | 2005-513757 A | 5/2005 | |
| JP | 2006-060214 A | 3/2006 | |
| JP | 2006-313866 A | 11/2006 | |
| JP | 2008-028389 A | 2/2008 | |
| JP | 2008-182097 A | 8/2008 | |
| TW | 200737295 A | 10/2007 | |
| TW | 200739276 A | 10/2007 | |
| TW | 200813654 A | 3/2008 | |
| TW | 200821770 A | 5/2008 | |
| TW | 200832584 A | 8/2008 | |
| WO | WO 2008/015973 A1 | 2/2008 | |

OTHER PUBLICATIONS

Yuito, T., et al., "Fresnel diffraction mask for focus monitoring," J. Vac. Sci. Technol. 22(3):977-980, American Vacuum Society, 2004; pp. 977-980.

International Search Report directed to related International Patent Application No. PCT/EP2009/067403, mailed Jul. 22, 2010, from the European Patent Office; 4 pages.

International Preliminary Report on Patentability with the Written Opinion of the International Searching Authority directed to related International Patent Application No. PCT/EP2009/067403, issued Jul. 5, 2011, from the International Bureau of WIPO; 9 pages.

International Search Report directed to related International Patent Application No. PCT/EP2010/056016, mailed Aug. 26, 2010, from the European Patent Office; 3 pages.

International Preliminary Report on Patentability with the Written Opinion of the International Searching Authority directed to related International Patent Application No. PCT/EP2010/056016, issued Nov. 15, 2011, from the International Bureau of WIPO; 9 pages.

English-Language Abstract for Taiwanese Patent Publication No. 200737295 A, published October 1, 2007; 1 page.

English-Language Abstract for Japanese Patent Publication No. 2001-250760 A, published September 14, 2001; 1 page.

English-Language Abstract for Japanese Patent Publication No. 06-120118 A, published Apr. 28, 1994; 1 page.

English-Language Abstract for Japanese Patent Publication No. 10-154647 A, published Jun. 9, 1998; 1 page.

English-Language Abstract for Japanese Patent Publication No. 2000-114158 A, published Apr. 21, 2000; 1 page.

Non-Final Rejection mailed Nov. 13, 2013 for U.S. Appl. No. 13/140,292, filed Jun. 16, 2011; 24 pages.

Final Rejection mailed Jun. 3, 2014 for U.S. Appl. No. 13/140,292, filed Jun. 16, 2011; 22 pages.

\* cited by examiner

Focus Error for 2 Different BARC Thicknesses

INSPECTION METHOD FOR LITHOGRAPHY

CROSS-REFERENCE TO RELATED APPLICATIONS

This application claims the benefit of U.S. provisional application 61/177,468, which was filed on May 12, 2009, and which is incorporated herein in its entirety by reference.

BACKGROUND

1. Field of the Invention

The present invention relates to methods of inspection usable, for example, in the manufacture of devices by lithographic techniques and to methods of manufacturing devices using lithographic techniques.

2. Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, it is necessary to measure parameters of the patterned substrate, for example the overlay error between successive layers formed in or on it. There are various techniques for making measurements of the microscopic structures formed in lithographic processes, including the use of scanning electron microscopes and various specialized tools. One form of specialized inspection tool is a scatterometer, in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometers are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Scatterometers may be used to measure several different aspects of lithographic apparatuses, including their positioning errors of the substrate prior to exposure and exposure efficacy. Two important parameters of a lithographic apparatus (and specifically of the exposure action that the lithographic apparatus carries out) that may also be measured by scatterometers are focus and dose. A lithographic apparatus has an exposure apparatus that includes a radiation source and a projection system as mentioned below. The radiation source provides a beam of radiation and the projection system focuses the beam of radiation and applies a pattern to the beam to create a patterned beam of radiation that strikes the resist on the substrate surface.

The dose of radiation that is projected onto a substrate in order to expose the substrate is controlled by various parts of the exposure apparatus. It is mostly the projection system of the lithographic apparatus that is responsible for the focus of the radiation onto the correct portions of the substrate. It is important that the focusing of the image of the pattern in the patterned radiation occurs at the surface of the substrate where the exposure occurs. This is so that the sharpest (i.e., most focused) image will occur on the surface of the substrate and the sharpest pattern possible may be exposed thereon. This allows smaller product patterns to be printed.

The focus and dose of the radiation directly affect various parameters of the patterns or structures that are exposed on the substrate. Parameters that can be measured using a scatterometer are physical properties of structures within the patterns that have been printed onto a substrate. These parameters may include the critical dimension (CD) or side wall angle (SWA). The critical dimension is effectively the mean width of a structure such as a bar (or a space, dot or hole, depending on what the measured structures are that are in the printed pattern). The side wall angle is the angle between the surface of the substrate and part of the rising (or falling) portion of the structure.

In addition, mask shape corrections (focus corrections for correcting for the bending of a mask) can be applied if scribe lane structures are used with a product mask for focus measurements.

SUMMARY

It is desirable to provide a method of measuring lithographic apparatus focus, using SWA measurements.

According to a first embodiment of the present invention, there is provided a method of determining the focus of a lithographic apparatus used in a lithographic process on a substrate comprising the following steps. Using the lithographic process to form at least two periodic structures on the substrate, each structure having at least one feature that has an asymmetry between opposing side wall angles which varies as a different function of the focus of the lithographic apparatus on the substrate. Measuring a spectrum produced by directing a beam of radiation onto the at least two periodic structures. Determining a ratio of the asymmetries for each of the features from the measured spectrum. Using the determined ratio and the relationship between the focus and the side wall asymmetry for each feature to determine the focus on the substrate.

According to a second embodiment of the present invention there is an angularly resolved scatterometer configured to determine focus of a lithographic apparatus used in a lithographic process on a substrate to form at least two periodic structures on the substrate, each structure having at least one feature which has an asymmetry between opposing side wall angles which varies as a different function of the focus of the lithographic apparatus on the substrate. The scatterometer comprises a detection arrangement and a determining arrangement. The detection arrangement is adapted to measure at least part of a spectrum produced by directing a beam of radiation onto the at least two periodic structures. The determining arrangement is adapted to determine the ratios of the asymmetries for each of the features from the measured spectrum and to use the determined ratio and the relationship between the focus and the side wall asymmetry for each feature to determine the focus on the substrate.

According to a third embodiment of the present invention, there is provided a method of determining the focus of a lithographic apparatus used in a lithographic process on a substrate comprising the following steps. Using the lithographic process to form at least two targets on the substrate, each target having at least one parameter which varies as a different function of the focus of the lithographic apparatus on the substrate. Measuring a spectrum produced by directing a beam of radiation onto the at least two targets. Using the parameters for the at least two targets derived from the measured spectrum to determine a relationship between the parameter and focus which is substantially independent of the processing conditions for the lithographic apparatus.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to allow a person skilled in the relevant art(s) to make and use the invention.

Figure 1:
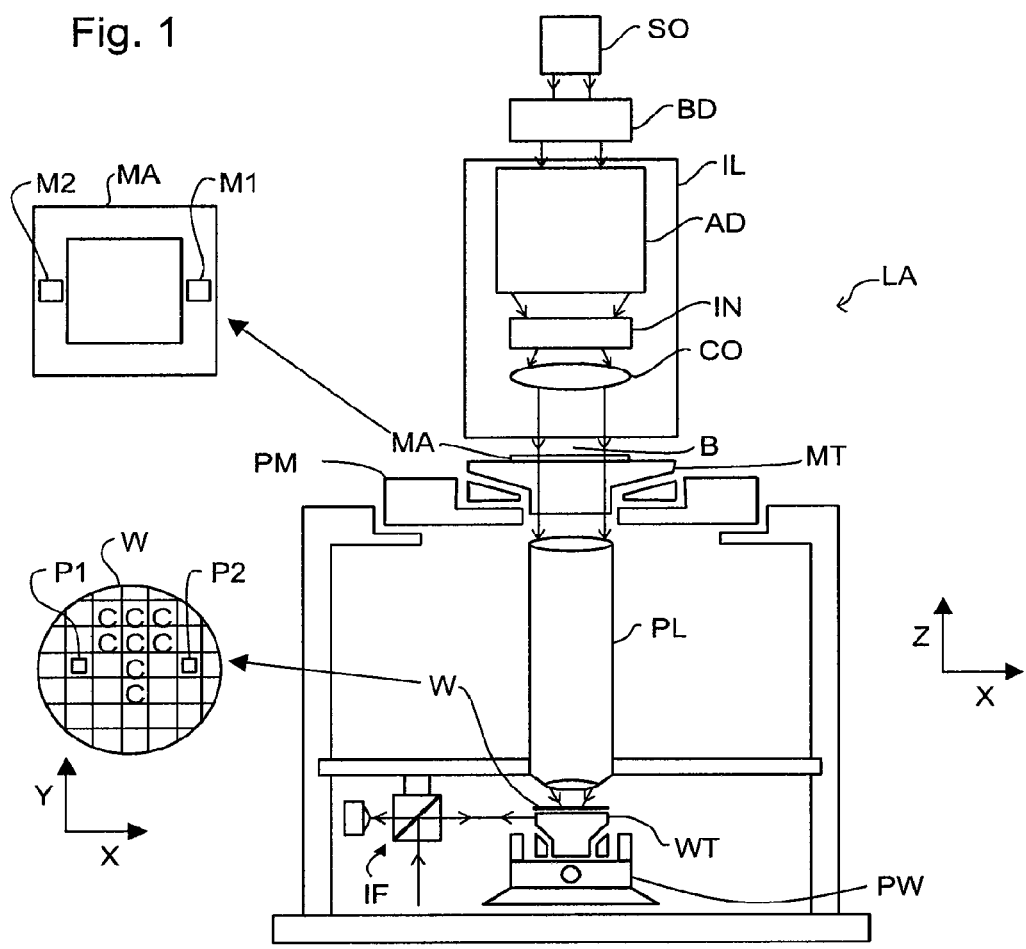
FIG. 1 depicts a lithographic apparatus, in accordance with an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts a lithographic apparatus. The apparatus comprises: an illumination system (illuminator) IL configured to condition a radiation beam B (e.g., UV radiation or DUV radiation); a support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist-coated wafer) W and connected to a second positioner PW configured to accurately position the substrate in accordance with certain parameters; and a projection system (e.g., a refractive projection lens system) PL configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-) magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
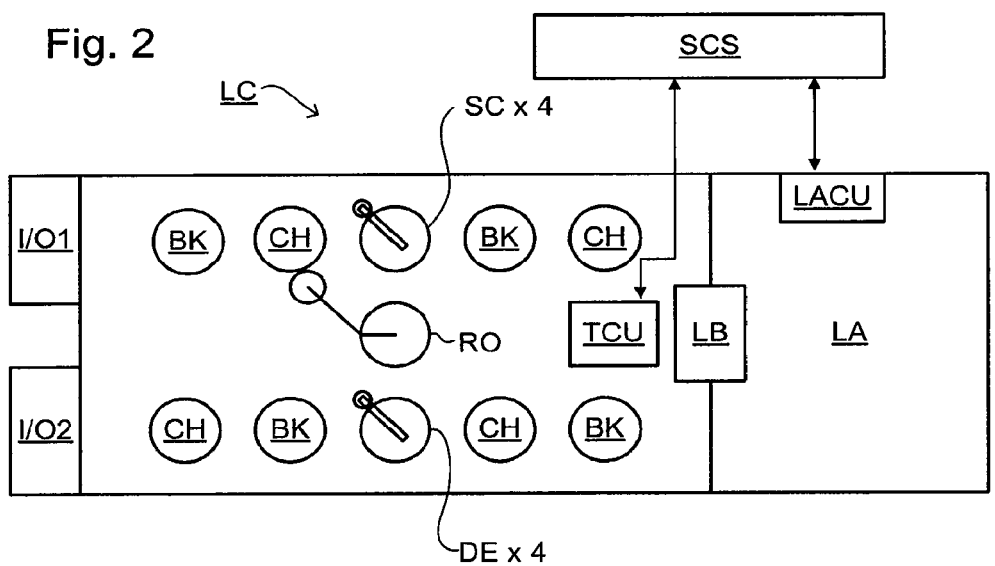
FIG. 2 depicts a lithographic cell or cluster, in accordance with an embodiment of the present invention.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded—thereby avoiding performing exposures on substrates that are known to be faulty. In a case where only some target portions of a substrate are faulty, further exposures can be performed only on those target portions that are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To allow most rapid measurements, it is desirable that the inspection apparatus measure properties in the exposed resist layer immediately after the exposure. However, the latent image in the resist has a very low contrast—there is only a very small difference in refractive index between the parts of the resist that have been exposed to radiation and those which have not—and not all inspection apparatus have sufficient sensitivity to make useful measurements of the latent image. Therefore measurements may be taken after the post-exposure bake step (PEB) that is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
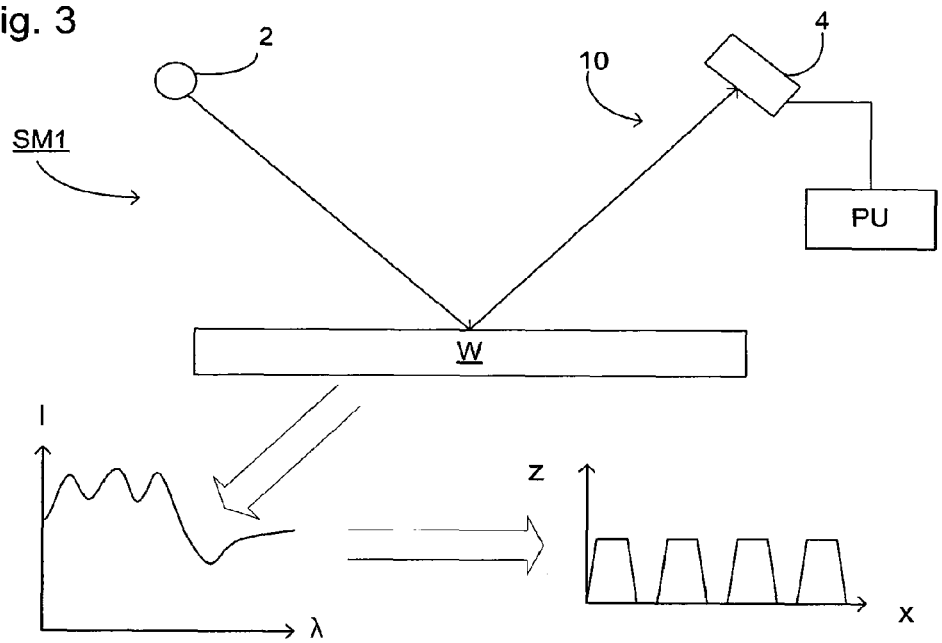
FIG. 3 depicts a first scatterometer, in accordance with an embodiment of the present invention.

FIG. 3 depicts a scatterometer SM1 which may be used in the present invention. It comprises a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g., by Rigorous Coupled Wave Analysis and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
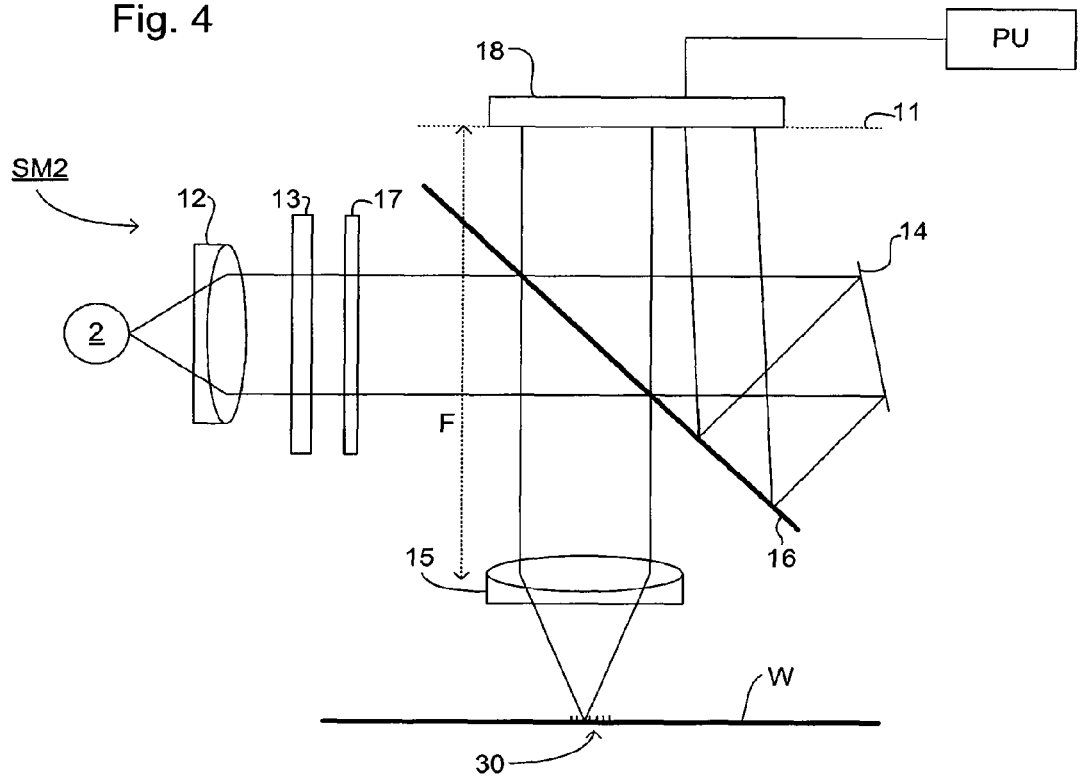
FIG. 4 depicts a second scatterometer, in accordance with an embodiment of the present invention.

Another scatterometer SM2 that may be used with the present invention is shown in FIG. 4. In this device, the radiation emitted by radiation source 2 is focused using lens system 12 through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflective surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of CCD or CMOS sensors.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18.

A set of wavelength filters 13 is available to select a wavelength of interest in the range of, say, 405-790 nm or even lower, such as 200-300 nm. The filter may be tunable rather than comprising a set of different filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e., one with a wide range of light frequencies or wavelengths—and therefore of colors) is possible, which gives a large etendue, allowing the mixing of multiple wavelengths. The plurality of wavelengths in the broadband preferably each has a bandwidth of *8 and a spacing of at least 2*8 (i.e., twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP1,628,164A.

The target 30 on substrate W may be a grating, which is printed such that after development, the bars are formed of solid resist lines. The bars may alternatively be etched into the substrate. This pattern is sensitive to aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the grating, such as line widths and shapes, may be input to the reconstruction process, performed by processing unit PU, from knowledge of the printing step and/or other scatterometry processes.

Figure 5:
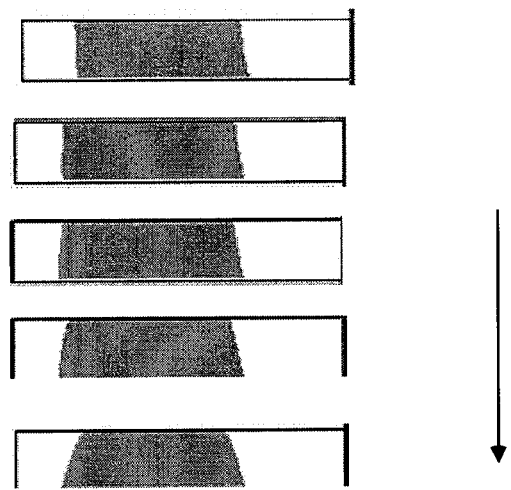
FIG. 5 depicts a variation in side wall angles as a function of focus, in accordance with an embodiment of the present invention.

FIG. 5 illustrates a variation in side wall angles of a pattern produced in a resist layer from a focus-sensitive target on a mask. For example, this is described in co-owned, co-pending application U.S. Provisional Application No. 61/141,410 ('the '410 Prov. App.), filed 30 Dec. 2008, which is incorporated by reference herein in its entirety. In 'the '410 Prov. App. there is disclosed embodiments covering a method of measuring focus using the asymmetry in the higher orders of the scattered light, caused by the different left and right side wall angles (SWAB) of a printed line structure as a function of focus. However, the inventors for the present application have found that, while a correlation between the asymmetry in the higher order of the scattered light as caused by the differences between side wall angles between the left and right edges of a printed resist line can be expressed as a function of the scanner focus, the function is dependent on a number of process parameters, in particular resist parameters, such as mid CD and height, and bottom anti reflection coating (BARC), such as BARC thickness. In particular, a variation in the BARC thickness produces a variation in the function, which will lead to an error in the focus measurements deduced from the SWA difference, which is derived in turn from the scatterometry measurements.

As can be seen in the example in FIG. 5, as the exposure focus increases, the side wall angles measured relative to the plane parallel to the substrate surface increase as a function of focus, the left and right values of the side wall angles converging to the same value with the increase in focus.

Figure 6:
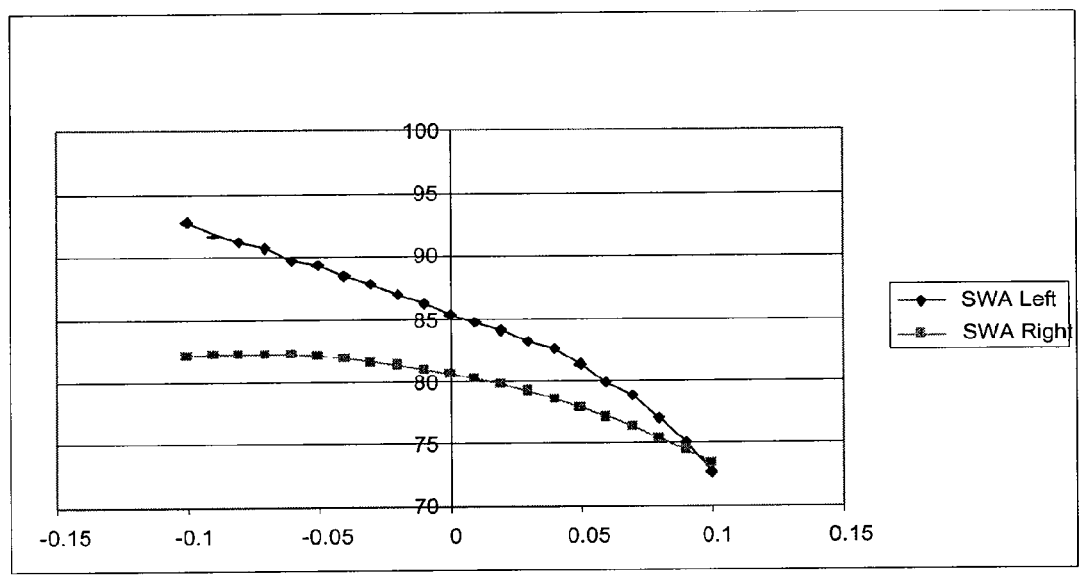
FIG. 6 depicts a variation in left and right side wall angles as a function of focus, in accordance with an embodiment of the present invention.

This is also shown in FIG. 6, which shows the side wall angles of the right and left sides of a structure profile, according to an embodiment of the present invention. In FIG. 6, the diamond-shaped points represent the left side wall angles whilst the square-shaped dots represent the right side wall angles. From FIG. 6, it can be seen that the exposed pattern exhibits a difference in side wall angle as a monotonic function of the exposure focus. On the far left of the graph, the side wall angles for the right and left sides of the profile are quite divergent. However, the values of the side wall angles converge as the exposure focus increases towards the right hand side of the graph. Thus, the differences in the left and right side wall angles can be used as a determination of the focus of the exposure beam.

In particular, $$SWA_{LEFT} - SWA_{RIGHT} = \Delta SWA = G(Z)$$

where Z is the exposure focus and G is a function describing the SWA difference versus the focus. Simulations have found that the function G is monotonous over a large range of focus and can be approximated by a parabolic curve of a small curvature. The SWA asymmetry shows up as an intensity difference between the +1 and −1 diffraction orders in the measured scatterometry spectrum. It will be appreciated that higher diffraction orders show a similar effect, although the first order diffraction orders have the strongest signal. For small SWA asymmetries, asymmetry A, that is the difference between the intensities $I_{+1}$ and $I_{-1}$ is given as:

$$I_1 - I_{+1} = A = K \times \Delta SWA$$

where K is a process dependent proportionality factor.

In one example, the value of K is dependent on processing features, such as BARC thickness or thicknesses of other processing layers that are present on the substrate. In a particular example, for a grating structure having a mid CD of 260 nm, grating pitch of 600 nm, grating height of 60 nm, a side wall angle SWA of 85° and a BARC thickness of 40 nm, comparing a spectrometry spectra measured at a wavelength of 425 nm with a reconstructed spectra, with floating resist parameters having the same mid CD, pitch, grating height and SWA, but with a fixed BARC thickness of 38 nm, leads to an error in the reconstructed SWA. In particular, the reconstructed SWA for illumination using overlapping orders is 69° and for segmented illumination in which the illumination is divided into a number of segments, e.g., four equal or non equal quadrants, in which some segments are illuminated and some are unilluminated is 75°. Assuming SWA sensitivity for the focus of 0.2° per nm, a focus error of 80 nm is produced for illumination and 50 nm for BMW illumination. Such a processing induced focus error may be too large for present day lithography processing requirements.

In accordance with an embodiment of the invention, the SWA asymmetry is measured for two different focus sensitive gratings printed on adjacent regions of the wafer W. The ratio of the asymmetries is derived and used, together with values derived from measurements and simulations for the gratings printed on a test wafer, to derive a value of the focus. This allows elimination of the process dependent proportionality factor K and allows determination of a value of the focus from the measured asymmetries A of at least two different focus sensitive gratings, which focus value is not sensitive to the BARC thickness.

By using two focus sensitive gratings as patterns, but each having a different asymmetric SWA response, two asymmetries can be measured on two adjacent targets on the wafer as follows.

$$A_1 = K \times G_1(Z)$$

$$A_2 = K \times G_2(Z).$$

The functions $G_1$ and $G_2$ in the above two expressions describe the SWA asymmetry produced as a function of focus and can be determined from simulation and/or measurements done on a test wafer. Thus, the ratio of the measured asymmetries produces a measured value of $\gamma$:

$$\gamma = \frac{A_1}{A_2} = \frac{G_1(Z)}{G_2(Z)}$$

If $G_1$ is not a linear derivative of $G_2$ it is possible to solve this equation for the unknown focus term Z. In particular, the functions $G_1$ and $G_2$ should be as different as possible with the measured ratio $\gamma$ being a monotonous function of Z. Assuming, that the functions $G_1$ and $G_2$ are parabolic, it is possible to write:

$$\gamma = \frac{a_1 + b_1 Z + c_1 Z^2}{a_2 + b_2 Z + c_2 Z^2}$$

The above equation can be rewritten as:

$$\gamma(a_2 + b_2 Z + c_2 Z^2) = (a_1 + b_1 Z + c_1 Z^2)$$

Rearranging this expression yields the following quadratic equation for the unknown focus error Z:

$$(\gamma a_2 - a_1) + (\lambda b_2 - b_1) Z + (\gamma c_2 - c_1) Z^2 = 0 \quad \text{equation (1)}$$

This equation can be solved using standard methods for solving quadratic equations.

Figure 7:
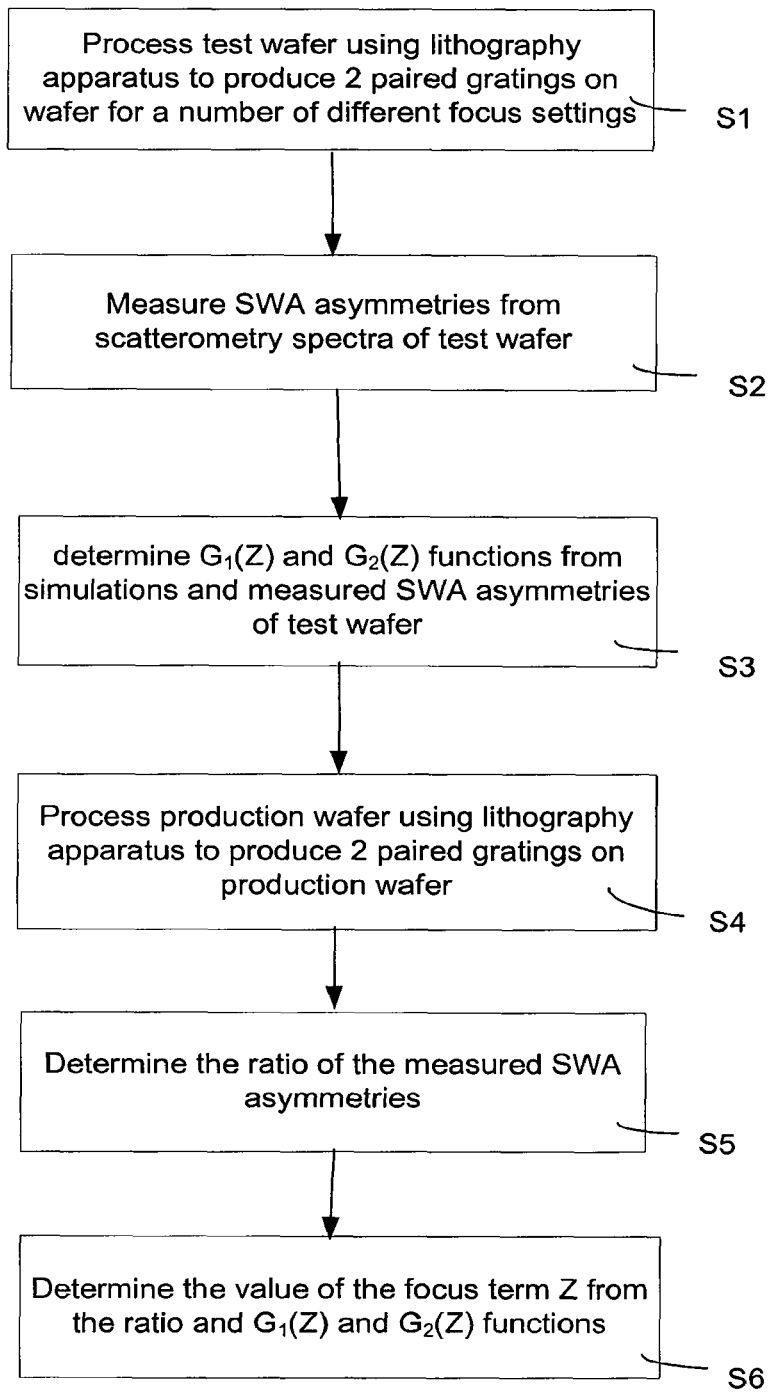
FIG. 7 illustrates a flowchart depicting a method, in accordance with an embodiment of the invention.

FIG. 7 illustrates a flowchart depicting a method, according to an embodiment of the present invention. In step S1, a test wafer is processed using lithography apparatus to produce two different gratings that are nominally identical but with a different focus sensitivity for side wall angle asymmetry on two adjacent portions of a test wafer. This is repeated for different focus settings. A scatterometer spectrum of all gratings on the test wafer is measured in S2 and the SWA asymmetry for the gratings is determined from the intensity measurements of the +1 and −1 diffraction orders. The ratio of the measured SWA asymmetries of two paired targets, that is two targets with different SWA asymmetry sensitivity that have been exposed with the same focus value, is determined from this, the value of the focus functions of $G_1(Z)$ and $G_2(Z)$ then being determined from the measured SWA asymmetries and simulations of the test wafer in step S3.

The same patterns are used to produce equivalent gratings on a production wafer in step S4, the ratio of the measured SWA asymmetries being determined in step S5. The value of the focus term Z is then derived from the ratio and the previously determined $G_1(Z)$ and $G_2(Z)$ functions in step S6.

Figure 8:
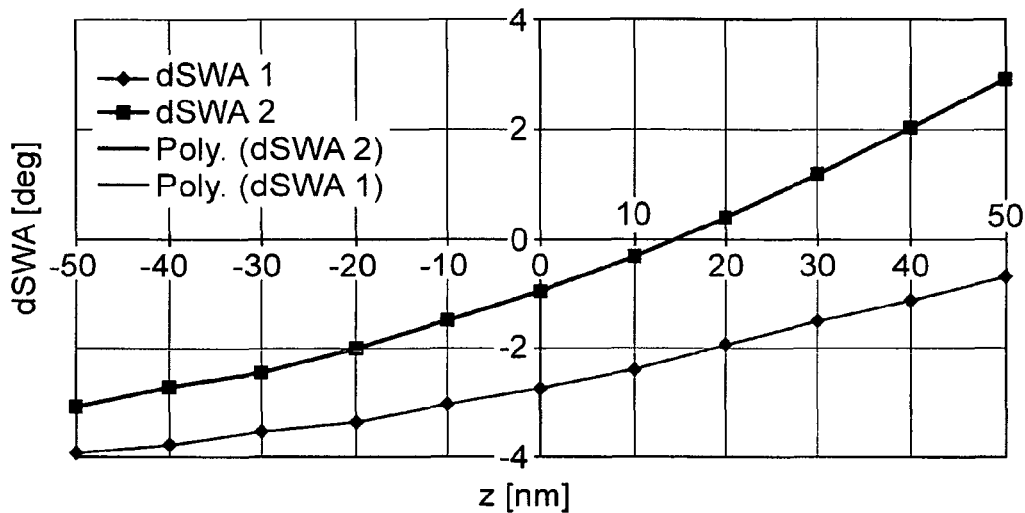
FIG. 8 depicts variation in side wall angle difference as a function of focus for two different focus sensitive gradients having different asymmetric side wall angle responses.

Turning now to the FIG. 8, this figure illustrates an example of the form of the functions $G_1(Z)$ and $G_2(Z)$ for the gratings produced on the test wafer in step S1, these functions being determined in step S3, according to an embodiment of the present invention. In this example, the triangular points show the function of the SWA asymmetry for the first grating as the equation $y = 1.69E-04x^2 + 3.28E-02x - 2.71E-00$, while the plot shown in square points shows a different function of the SWA for the second grating, $y = 3.62E-04x^2 + 5.96E-02x - 9.52E-01$, where the value of x in each equation corresponds to the value of Z. From these two functions it is possible to solve the parabolic equation (1) set out above.

Figure 9:
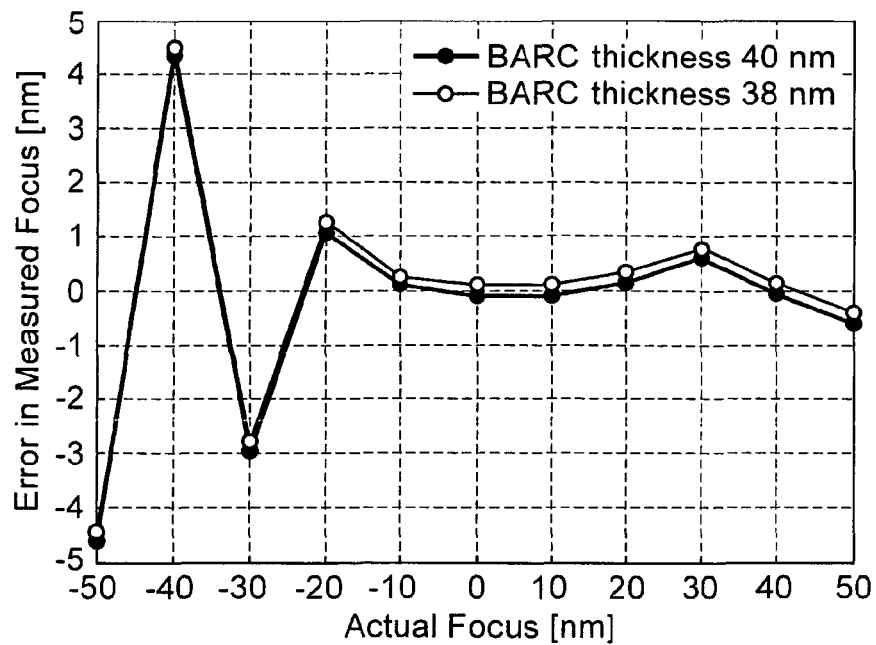
FIG. 9 depicts a focus error for two different bottom anti reflection coating (BARC) thicknesses calculated from SWA asymmetries using a method, in accordance with an embodiment of the present invention.

FIG. 9 illustrates the result of using a method, in accordance with an embodiment of the invention. In the plot shown in FIG. 9, the uppermost curve has been deliberately shifted 0.2 nm in the upward direction for clarity, as in reality the curves overlap to within 0.007 nm. The uppermost curve shows the error in the measured focus over a −50 to a +50 nm focus range for a grating structure on a nominal BARC thickness of 40 nm, while the lower curve shows the equivalent error for a grating structure on a nominal BARC thickness of 38 nm. The height of the resist lines is 60 nm and the pitch of both gratings was 600 nm, with the nominal mid CD being set to 310 nm. The data was obtained by measuring the asymmetry of only 1 pixel pair in the +1 and −1 diffraction orders. As can be seen, the error is in the order of a few nm, which should be appropriate for focus monitoring applications in lithographic processing. Furthermore a 2 nm BARC thickness variation has virtually no impact on the measured focus value.

It should be appreciated that using the method in accordance with embodiments of the present invention, no reconstruction of the scatterometry target is required so as to allow a high throughput on even complex products. The recipe for the lithography process therefore is easily set up and a high signal to noise ratio is obtained. The method is very process robust, hence the effects of process variations, such as BARC thickness on the focus measurement are eliminated. It will be appreciated that while in the embodiment described, particular account is taken of the BARC thickness, the effect of other process variations will also be substantially eliminated.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

CONCLUSION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method comprising:
   using a lithographic process to form at least two periodic structures on a substrate, each of the at least two periodic structures having at least one feature that has an asymmetry between opposing side wall angles that varies as a different function of a focus of a lithographic apparatus on the substrate;
   measuring a spectrum produced by directing a beam of radiation onto the at least two periodic structures;
   determining a ratio of asymmetries for each of the features from the measured spectrum; and
   using the ratio and a relationship between the focus and the side wall asymmetry for each of the features to determine the focus of the lithographic apparatus.

2. The method of claim 1, wherein the relationship between the focus and the side wall angle asymmetry is determined for each feature through calibration comprising:
   using the lithographic process to form test structures corresponding to the at least two structures on a test substrate of known characteristics;
   measuring a spectrum produced by directing a beam of radiation onto the test structures for a plurality of different focus settings; and
   using simulations and the measured spectrum to derive the relationships for each of the test structures.

3. The method of claim 1, wherein at least a portion of +1st and −1st diffraction orders of the spectrum are measured.

4. The method of claim 1, wherein the asymmetries are measured by measuring the intensity of portions of the measured spectrum.

5. An angularly resolved scatterometer configured to determine focus of a lithographic apparatus used in a lithographic process on a substrate to form at least two periodic structures on the substrate, each of the at least two periodic structures having at least one feature that has an asymmetry between opposing side wall angles that varies as a different function of the focus of the lithographic apparatus on the substrate, the scatterometer comprising:
   a detecting system configured to measure at least part of a spectrum produced by directing a beam of radiation onto the at least two periodic structures; and
   a determining system configured to determine ratios of the asymmetries for each of the features from the measured spectrum and to use the ratios and a relationship between the focus and the side wall asymmetry for each of the features to determine the focus on the substrate.

6. The scatterometer of claim 5, wherein the detecting system is configured to measure +1st and −1st diffraction orders of the spectrum.

7. The scatterometer of claim 5, wherein the asymmetries are measured by measuring an intensity of parts of the measured spectrum.

8. A lithographic system comprising:
   an illumination optical system arranged to illuminate a pattern;
   a projection optical system arranged to project an image of the pattern onto a substrate; and
   an angularly resolved scatterometer configured to determine focus of the lithographic system used to produce at least two periodic structures on the substrate, each of the at least two periodic structures having at least one feature that has an asymmetry between opposing side wall angles that varies as a different function of the focus of the lithographic apparatus on the substrate, the scatterometer comprising,
   a detection system configured to measure at least part of a spectrum produced by directing a beam of radiation onto the at least two periodic structures, and
   a determining system configured to determine ratios of the asymmetries for each of the features from the measured spectrum and to use the ratios and a relationship between the focus and the side wall asymmetry for each of the features to determine the focus on the substrate.

9. A lithographic cell comprising:
   a coater arranged to coat substrates with a radiation sensitive layer;
   a lithographic apparatus arranged to expose images onto the radiation sensitive layer of substrates coated by the coater;
   a developer arranged to develop images exposed by the lithographic apparatus; and
   an angularly resolved scatterometer configured to determine focus of the lithographic system used to produce at least two periodic structures on the substrate, each of the at least two periodic structures having at least one feature that has an asymmetry between opposing side wall angles that varies as a different function of the focus of the lithographic apparatus on the substrate, the scatterometer comprising, a detection system configured to measure at least part of a spectrum produced by directing a beam of radiation onto the at least two periodic structures, and a determining system configured to determine ratios of the asymmetries for each of the features from the measured spectrum and to use the ratios and a relationship between the focus and the side wall asymmetry for each of the features to determine the focus on the substrate.

10. A method comprising:

using a lithographic apparatus to form at least two targets on a substrate, each of the at least two targets having at least one parameter that varies as a different function of focus of a lithographic apparatus on the substrate;

measuring a spectrum produced by directing a beam of radiation onto the at least two targets; and using parameters for the at least two targets derived from the measured spectrum to determine a relationship between the parameter and the focus, which is independent of processing conditions for the lithographic apparatus.

11. The method of claim 10, wherein the parameter is the asymmetry between opposing side wall angles of a structure on each of the targets.

12. The method of claim 11, wherein the relationship is partially determined from the ratio of the asymmetries for each of the features from the measured spectrum.

13. The method of claim 11, wherein the relationship between the focus and the side wall angle asymmetry is partially determined for each of the features using calibration comprising:

using the lithographic apparatus to form test structures corresponding to the at least two targets on a test substrate of known characteristics;

measuring a spectrum produced by directing a beam of radiation onto the test structures on the test substrate for a plurality of different focus settings; and using simulations and the measured spectrum to derive the relationships for each structure.

14. The method of claim 10, wherein at least a portion of +1st and −1st diffraction orders of the spectrum are measured.

15. The method of claim 10, wherein the asymmetries are measured by measuring an intensity of portions of the measured spectrum.

16. An angularly resolved scatterometer configured to determine focus of a lithographic apparatus used in a lithographic process on a substrate to form at least two periodic structures on the substrate, each of the at least two periodic structures having at least one feature that has an asymmetry between opposing side wall angles that varies as a different function of the focus of the lithographic apparatus on the substrate, the scatterometer comprising:

a detector configured to measure at least part of a spectrum produced by directing a beam of radiation onto the at least two periodic structures; and a determining device configured to determine ratios of the asymmetries for each of the features from the measured spectrum and to use the ratios and a relationship between the focus and the side wall asymmetry for each of the features to determine the focus on the substrate.

17. The scatterometer of claim 16, wherein the detector is configured to measure +1st and −1st diffraction orders of the spectrum.

18. The scatterometer of claim 17, wherein the asymmetries are measured by measuring an intensity of parts of the measured spectrum.

19. A lithographic apparatus comprising:

an illumination optical system arranged to illuminate a pattern;

a projection optical system arranged to project an image of the pattern on to a substrate; and an angularly resolved scatterometer configured to determine focus of the lithographic apparatus used in a lithographic process on the substrate to form at least two periodic structures on the substrate, each of the at least two periodic structures having at least one feature that has an asymmetry between opposing side wall angles that varies as a different function of the focus of the lithographic apparatus on the substrate, the scatterometer comprising, a detector configured to measure at least part of a spectrum produced by directing a beam of radiation onto the at least two periodic structures, and a determining device configured to determine ratios of the asymmetries for each of the features from the measured spectrum and to use the ratios and a relationship between the focus and the side wall asymmetry for each of the features to determine the focus on the substrate.

20. A lithographic cell comprising:

a coater arranged to coat substrates with a radiation sensitive layer;

a lithographic apparatus arranged to expose images onto the radiation sensitive layer of substrates coated by the coater;

a developer arranged to develop images exposed by the lithographic apparatus; and an angularly resolved scatterometer configured to determine focus of the lithographic apparatus used in a lithographic process on the substrate to form at least two periodic structures on the substrate, each of the at least two periodic structures having at least one feature that has an asymmetry between opposing side wall angles that varies as a different function of the focus of the lithographic apparatus on the substrate, the scatterometer comprising, a detector configured to measure at least part of a spectrum produced by directing a beam of radiation onto the at least two periodic structures, and a determining device configured to determine ratios of the asymmetries for each of the features from the measured spectrum and to use the ratios and a relationship between the focus and the side wall asymmetry for each of the features to determine the focus on the substrate.

* * * * *